United States Patent
Tsuji et al.

(10) Patent No.: US 7,679,435 B2
(45) Date of Patent: Mar. 16, 2010

(54) DIGITAL INPUT CLASS-D AMPLIFIER

(75) Inventors: Nobuaki Tsuji, Hamamatsu (JP);
Hirotaka Kawai, Hamamatsu (JP);
Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 2 days.

(21) Appl. No.: 12/075,941

(22) Filed: Mar. 14, 2008

(65) Prior Publication Data

US 2008/0224773 A1  Sep. 18, 2008

(30) Foreign Application Priority Data

Mar. 16, 2007  (JP) .............................. 2007-068796

(51) Int. Cl.
*H03F 3/68* (2006.01)
(52) U.S. Cl. ...................... 330/10; 330/207 A; 330/251
(58) Field of Classification Search ................... 330/10, 330/251, 207 A
See application file for complete search history.

(56) References Cited

U.S. PATENT DOCUMENTS

| | | | |
|---|---|---|---|
| 4,935,740 A | 6/1990 | Schouwenhaars et al. | |
| 6,535,154 B1 | 3/2003 | Sculley | |
| 6,535,155 B2 | 3/2003 | Ruha et al. | |
| 6,594,309 B1 | 7/2003 | Botti et al. | |
| 7,456,685 B2 * | 11/2008 | Chen ........................... | 330/10 |
| 2005/0156665 A1 | 7/2005 | Maejima | |
| 2005/0253649 A1 | 11/2005 | Morishima | |
| 2006/0092063 A1 | 5/2006 | Ido et al. | |
| 2006/0176203 A1 | 8/2006 | Grosso et al. | |
| 2006/0255992 A1 | 11/2006 | Sakiyama et al. | |
| 2007/0040720 A1 | 2/2007 | Kim | |
| 2007/0279126 A1 * | 12/2007 | Krishnan et al. ............... | 330/10 |

FOREIGN PATENT DOCUMENTS

| | | |
|---|---|---|
| EP | 1001526 A1 | 5/2000 |
| JP | 1204527 | 8/1989 |
| JP | 2001085998 | 3/2001 |
| JP | 2006191176 A | 7/2006 |
| JP | 2006304084 | 11/2006 |
| KR | 2006-47660 | 5/2006 |

OTHER PUBLICATIONS

European Patent Office: Search Report for Application No. 08004829.1-2215, dated Jun. 25, 2008; 8 pgs.
Grosso, et al., "A 250 W Audio Amplifier with Straightforward Digital Input—PWM Output Conversion"; pp. 225-228, dated Sep. 18, 2001.
Meroni, et al., "A 4×40W Digital Input Class-AB Power DAC with 100dB Dynamic Range; pp. 1-10," dated Feb. 9, 2003.
Korean Intellectual Property Office: Notice of Prelliminary Rejection. (dated Nov. 25, 2009, 2 pgs.).

* cited by examiner

*Primary Examiner*—Khanh V Nguyen
(74) *Attorney, Agent, or Firm*—Pillsbury Winthrop Shaw Pittman LLP

(57) ABSTRACT

A digital input class-D amplifier includes a decoder which outputs a plurality of lines of time-series digital signals having a density of 1 or 0 conforming to an input digital signal, an error integrator which integrates a difference between a drive waveform to be applied to a load and a sum of the plurality of lines of time-series digital signals output from the decoder, and a modulation circuit which generates a pulse modulated with a pulse width or a pulse density based on a result of integration performed by the error integrator. The load is driven in accordance with the pulse generated by the modulation circuit.

5 Claims, 8 Drawing Sheets

DIGITAL INPUT CLASS-D AMPLIFIER

BACKGROUND

The present invention relates to a digital input class-D amplifier suitable for use as a power amplifier of audio equipment.

The class-D amplifier is an amplifier which generates a pulse train subjected to pulse-width modulation or pulse-density modulation in accordance with an input signal and which drives a load by means of the pulse train. The class-D amplifier is often used as a power amplifier which drives a speaker in audio equipment or the like. The class-D amplifier is for causing an electric current to flow to a load by means of switching operation without causing a d.c. bias current to flow into an output transistor connected directly to the load. Hence, the class-D amplifier has an advantage of little wasteful power being consumed by an output transistor and the ability to drive the load with high efficiency.

[Patent Document 1] JP-A-1-204527
[Patent Document 2] JP-A-2006-304084
[Patent Document 3] JP-A-2001-85998

Incidentally, in the class-D amplifier, a modulation signal used for pulse-width modulation, or the like, must be an analogue signal. Therefore, when a signal, an object of reproduction, which is acquired from a sound source or the like is a digital signal, the digital signal must be converted into an analogue signal or a bit stream (e.g., a bit stream acquired through $\Delta\Sigma$) which can be regarded being identical with an analogue signal, and the analogue signal or the bit stream must be supplied to the class-D amplifier. When there is adopted a configuration of subjecting a digital signal to digital-to-analogue conversion and supplying an analogue signal to the class-D amplifier, there is a problem of playback quality, or the like, being affected by an error arising at the time of digital-to-analogue conversion.

SUMMARY

The present invention has been conceived in view of the circumstance and aims at providing a digital input class-D amplifier which involves a small error in digital-to-analogue conversion and which can drive a load by means of a drive waveform faithful to a waveform indicated by an input digital signal.

A DEM (Dynamic Element Matching) technique is available as a technique for enhancing the accuracy of digital-to-analogue conversion. The present invention aims at solving the foregoing drawbacks by application of the DEM technique.

Specifically, the present invention provides a digital input class-D amplifier including a decoder which outputs a plurality of lines of time-series digital signals having a density of 1 or 0 conforming to an input digital signal, an error integrator which integrates a difference between a drive waveform applied to a load and a sum of the plurality of lines of time-series digital signals output from the decoder; and a modulation circuit which generates a pulse modulated with a pulse width or a pulse density based on a result of integration performed by the error integrator. The load is driven in accordance with the pulse generated by the modulation circuit.

According to the above configuration, a result of integration of a sum of lines; namely, a plurality of lines of time-series digital signals, comes to an analogue signal accurately reflecting an input digital signal. Accordingly, a load can be driven by a drive waveform accurately reflecting an input digital signal.

For instance, Patent Documents 1 through 3 are available as publications relevant to the DEM technique. However, in contrast with the present invention, the publications do not disclose that, in a digital input class-D amplifier, an input digital signal is provided to a DEM decoder and that a sum of a plurality of lines of time-series digital signals output from the DEM decoder is provided to an error integrator.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the present invention will be described hereunder by reference to the drawings.

Figure 1:
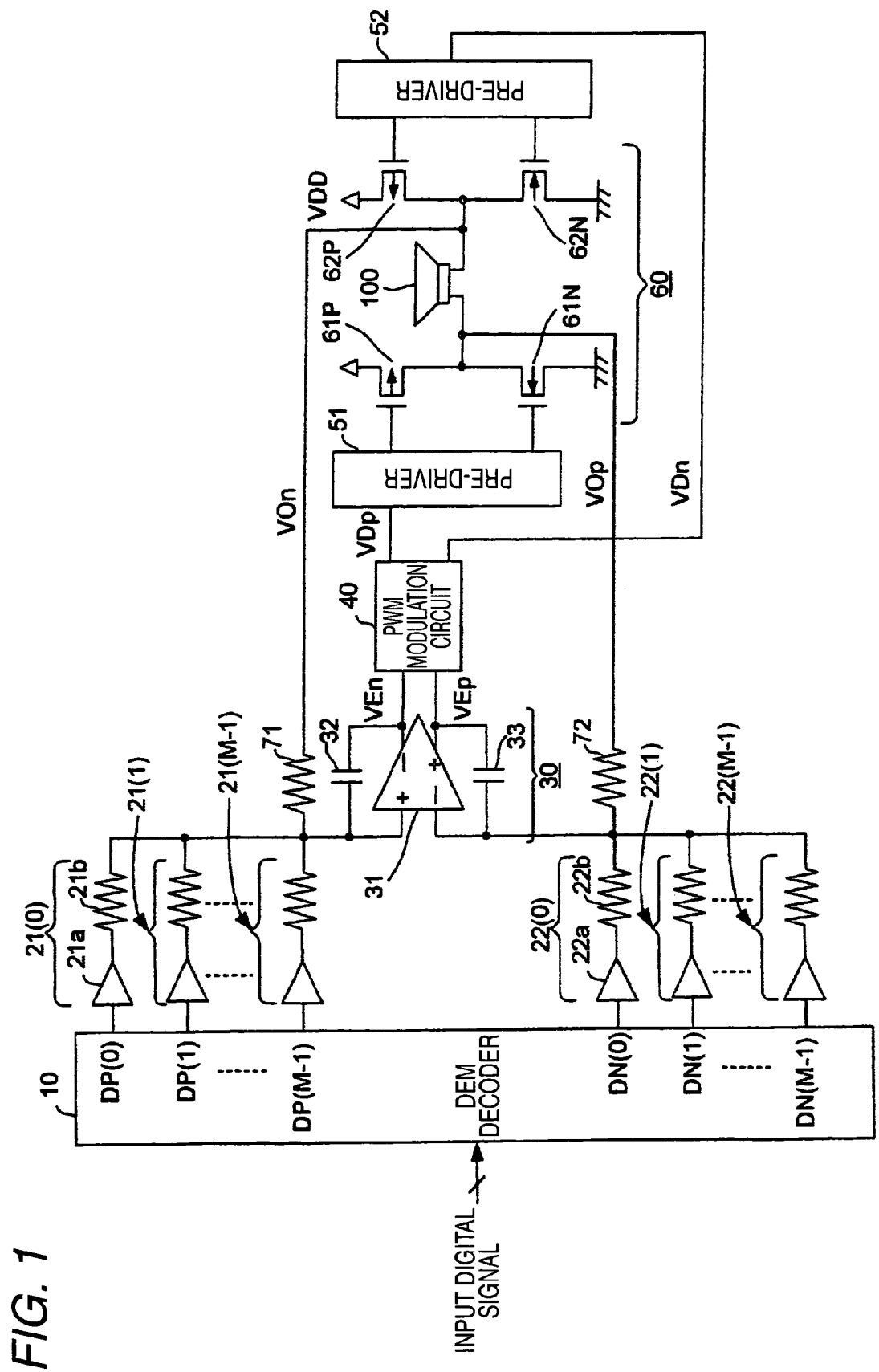
FIG. 1 is a circuit diagram showing the configuration of a digital input class-D amplifier according to an embodiment of the present invention.
Figure 2:
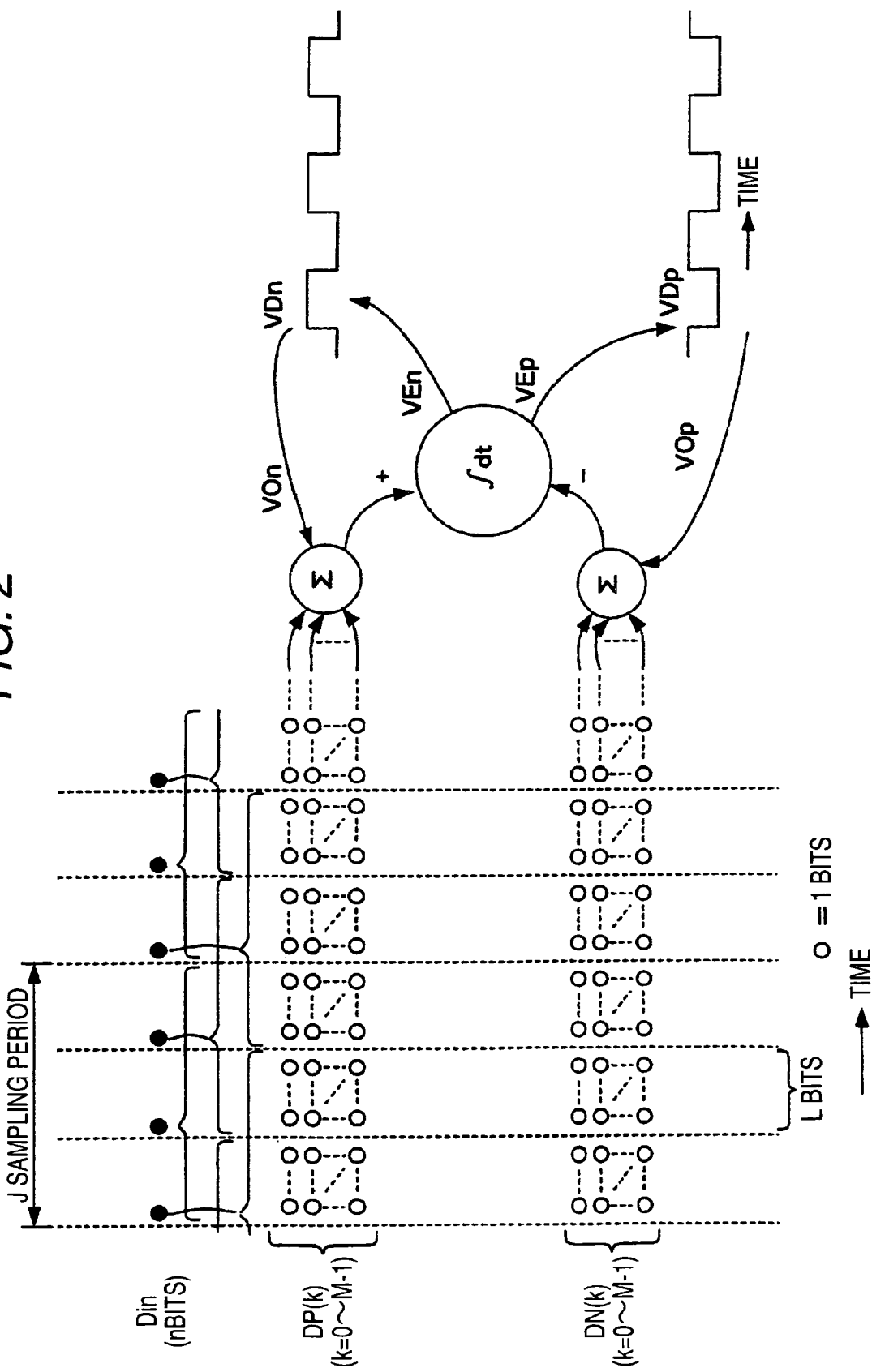
FIG. 2 is a view showing processing specifics of the digital input class-D amplifier.

FIG. 1 is a circuit diagram showing the configuration of a digital input class-D amplifier which is an embodiment of the present invention. FIG. 2 is a view showing processing specifics of the digital input class-D amplifier of the present embodiment. In FIG. 1, a DEM (Dynamic Element Matching) decoder 10 is supplied with an n-bit input digital signal Din from a sound source, or the like, at a sampling period of a predetermined time length. In accordance with the DEM algorithm, the DEM decoder 10 converts the n-bit input digital signal Din supplied by the sound source, or the like, into M-lines time-series digital signals DP(k) (k=0 to M−1) respectively having an L-times bit frequency and M-series time-series digital signals DN(k) (k=0 to M−1) respectively having an L-times bit frequency. The DEM decoder 10 sequentially outputs each of bits of the time-series digital signals DP(k) (k=0 to M−1) and bits of the time-series digital signals DN(k) (k=0 to M−1) by utilization of sub-periods determined by dividing one sampling period by L. The number of series M of the time-series digital signals DP(k) (k=0 to M−1) and DN(k) (k=0 to M−1) are assumed to be an integral multiple of $2^n$. Further, the multiplying factor L for the bit frequency of the input digital signal Din of the bit frequency of the time-series digital signal DP(k) (k=0 to M−1) and for the bit frequency of the time-series digital signal DN(k) (k=0 to M−1) is also set to an integral multiple of $2^n$.

Various algorithms are considered as a DEM algorithm suitable for the present embodiment. However, any algorithm is acceptable, so long as the algorithm generates the time-series digital signals DP(k) (k=0 to M−1) and DN(k) (k=0 to M−1) from the input digital signal Din so as to fulfill at least the following conditions.

a. As shown in FIG. 2, the density of "1" of all bits (M×L×J bits) of the time-series digital signals DP(k) (k=0 to M−1) arising in J sampling periods, each of the J sampling periods including a sampling period during which a sample of the input digital signal Din is given and preceding and subsequent sampling periods of the sampling period, and the density of "0" of all bits (M×L×J bits) of the time-series digital signals DN(k) (k=0 to M−1) arising in the J sampling periods become proportional to a sample value of the input digital signal Din.

b. In an arbitrary sampling period, the density of appearance (probability of appearance) of "1" or "0" per bit of the time-series digital signal DP(k) (k=0 to M−1) becomes uniform among bits, and the density of appearance of "1" or "0" per bit of the time-series digital signal DN(k) (k=0 to M−1) becomes uniform among bits.

As shown in FIG. 1, the time-series digital signal DP(k) (k=0 to M−1) output from the DEM decoder 10 is supplied to each of voltage current conversion sections 21(k) (k=0 to M−1) which consists of a noninverting buffer 21a and a resistor 21b. The time-series digital signals DN(k) (k=0 to M−1) output from the DEM decoder 10 are delivered to voltage-current conversion sections 22(k) (k=0 to M−1), each of which includes a noninverting buffer 22a and a resistor 22b. Under an ideal circumstance, the resistors 21b of the voltage-current conversion sections 21(k) (k=0 to M−1) and the resistors 22b of the voltage-current conversion section 22(k) (k=0 to M−1) assume an identical value of resistance R.

An error integrator 30 includes a differential amplifier 31 and capacitors 32 and 33 for integration purpose. The capacitor 32 is interposed between a negative phase output terminal (a minus output terminal) and a positive phase input terminal (a positive input terminal) of the differential amplifier 31. The capacitor 33 is interposed between a positive phase output terminal (a positive output terminal) and a negative phase input terminal (a negative input terminal) of the differential amplifier 31.

Respective current output terminals of the voltage-current conversion sections 21(k) (k=0 to M−1) (ends among both ends of the resistors 21b, which are not connected to the noninverting buffers 21a) are connected commonly to the positive-phase input terminal (the positive input terminal) of the differential amplifier 31 of the error integrator 30. Moreover, respective current output terminals of the voltage-current conversion sections 22(k) (k=0 to M−1) (ends among both ends of the resistors 22b, which are not connected to the noninverting buffers 22a) are connected commonly to the negative-phase input terminal (the negative input terminal) of the differential amplifier 31 of the error integrator 30. Further, an electric current conforming to the voltage VOn output from an output buffer 60 to be described later is negatively fed back to the positive-phase input terminal of the differential amplifier 31 by way of a resistor 71, and an electric current conforming to the voltage VOp output from the output buffer 60 to be described later is negatively fed back to the negative phase input terminal by way of a resistor 72.

A total sum of electric currents supplied to the positive-phase input terminal of the differential amplifier 31 by way of the voltage-current conversion sections 21(k) (k=0 to M−1) and a total sum of electric currents supplied to the negative-phase input terminal of the differential amplifier 31 by way of the voltage-current conversion sections 22(k) (k=0 to M−1) serve as input analogue signals of two phases, the positive phase and the negative phase, to the error integrator 30. When the source voltage of the digital input class-D amplifier of the present embodiment is VDD, the differential amplifier 31 performs, while receiving negative feedback, differential amplification of input analogue signals of two phases, the positive and negative phases, with the potential of the positive-phase input terminal and the potential of the negative-phase input terminal being virtually grounded to; for example, a level of VDD/2. Carrier signals resultant from integration of input analogue signals of respective phases are stored in the capacitors 32 and 33, and the error integrator 30 outputs integration result signals VEp and VEn of two phases, the positive phase and the negative phase, showing a result of integration.

The PWM modulation circuit 40 is a circuit which compares the integration result signals VEp and VEn output from the error integrator 30 with a triangular wave of a predetermined frequency, which generates pulses VDp and VDn pulse-width modulated according to a voltage difference VEp-VEn between the integration result signals VEp and VEn, and which supplies the pulses to pre-drivers 51 and 52. In more detail, when the voltage difference VEp-VEn is positive, the PWM modulation circuit 40 supplies the pre-driver 51 with the pulse VDp having a pulse width which is longer than one-half of the period of the triangular wave by a time length conforming to the voltage difference VEp-VEn, as well as supplying the pre-driver 52 with a pulse VDn resultant from phase inversion of the pulse VDp. When the voltage difference VEp-VEn is negative, the PWM modulation circuit 40 supplies the pre-driver 51 with a pulse VDp having a pulse width shorter than one-half the period of the triangular wave by a time length conforming to the voltage difference VEn-VEp, as well as supplying the pre-driver 52 with the pulse VDn obtained as a result of phase reversal of the pulse VDp.

An output buffer 60 includes a P-channel MOS output transistor 61P and an N-channel MOS output transistor 61N connected in series and a P-channel MOS output transistor 62P and an N-channel MOS output transistor 62N connected in series. The P-channel MOS output transistor 61P and the N-channel MOS output transistor 61N are interposed between the power source VDD and a ground. The P-channel MOS output transistor 62P and the N-channel MOS output transistor 62N are interposed between the power source VDD and the ground. A load 100 having a speaker, a low-pass filter, and the like, is interposed between a junction of drains of the output transistors 61P and 61N and a junction of drains of the output transistors 62P and 62N.

The pre-drivers 51 and 52 supply pulses to gates of the respective transistors 61P, 61N, 62P, and 62N so that power is fed to the load 100 by way of the output transistors 61P and 62N during a period conforming to the pulse width of the pulse VDp and that power is fed to the load 100 by way of the output transistors 62P and 61N during a period conforming to the pulse width of the pulse VDn. In order to prevent occurrence of a so-called through current, the pre-drivers 51 and 52 each include a circuit which controls a timing of pulses supplied to the gates of the respective transistors so that two P-channel transistors and N-channel transistors connected in series without involvement of the load 100 (i.e., a set consisting of the output transistors 61P and 61N and a set consisting of the output transistors 62P and 62N are not activated simultaneously.

An output voltage VOp developing in a node between the drain of the output transistor 61P and the drain of the output transistor 61N in the output buffer 60 is negatively fed back to the negative-phase input terminal of the differential amplifier 31 of the error integrator 30 by way of a resistor 72. Moreover, an output voltage VOn developing in a node between the drain of the output transistor 62P and the drain of the output transistor 62N in the output buffer 60 is negatively fed back to the positive-phase input terminal of the differential amplifier 31 of the error integrator 30 by way of a resistor 71.

The above are details of the digital input class-D amplifier of the present embodiment.

As shown in FIG. 2, according to the present embodiment, the DEM decoder 10 generates the time-series digital signals DP(k) (k=0 to M−1), each of which has a bit frequency that is L times the frequency of the input digital signal Din and which has a density of "1" conforming to the sample value of the input digital signal Din, as well as generating the time-series digital signal DN(k) (k=0 to M−1), each of which has the same bit frequency and which has a density of "0" conforming to the sample value. The electric currents conforming to the time-series digital signals DP(k) (k=0 to M−1) are imparted to the error integrator 30 by way of the voltage-current conversion section $21(k)$ (k=0 to M−1), and the electric currents conforming to the time-series digital signals DN(k) (k=0 to M−1) are imparted to the error integrator 30 by way of the voltage-current conversion section $22(k)$ (k=0 to M−1).

While receiving a negative feedback of the signal conforming to the drive waveform imparted to the load 100, the error integrator 30 integrates the input analogue signals of two phases, the positive phase and the negative phase, which are the sum of the electric currents conforming to the respective time-series digital signals DP(k) (k=0 to M−1) and the sum of the electric currents conforming to the respective time-series digital signals DN(k) (k=0 to M−1). The PWM modulation circuit 40 generates the pulses VDp and VDn having a pulse width conforming to the result of integration, and the pre-drivers 51 and 52 and the output buffer 60 drive the load 100 in accordance with the pulses VDp and VDn.

Integration of a difference between the sum of the electric currents conforming to the time-series digital signals DP(k) (k=0 to M−1) and the sum of the electric currents conforming to the time-series digital signals DN(k) (k=0 to M−1), generation of the pulses VDp and VDn having a pulse width conforming to a result of the integration, and driving of the load 100 in accordance with the pulses are performed while the negative feedback from the load 100 is controlled. As a result, the load 100 assumes a drive waveform formed by averaging along the time axis a difference between the sum of the time-series digital signals DP(k) (k=0 to M−1) and the sum of the time-series digital signals DN(k) (k=0 to M−1).

Under the ideal circumstance where no variations exist in the resistance values of the respective resistors 21b of the voltage-current conversion sections $21(k)$ (k=0 to M−1), the respective voltage-current conversion sections $21(k)$ output an electric current ΔI [=VDD/(2R)] during a period in which the time-series digital signals DP(k) imparted to the respective voltage-current conversion sections assume a value of "1", and output an electric current −ΔI [=−VDD/(2R)] during a period in which the time-series digital signals DP(k) imparted to the respective voltage-current conversion sections assume a value of "0". Likewise, under the ideal circumstance where no variations exist in the resistance values of the respective resistors 22b of the voltage-current conversion sections $22(k)$ (k=0 to M−1), the respective voltage-current conversion sections $22(k)$ output the electric current ΔI during a period in which the time-series digital signals DN(k) imparted to the respective voltage-current conversion sections assume a value of "1", and output the electric current −ΔI during a period in which the time-series digital signals DN(k) imparted to the respective voltage-current conversion sections assume a value of "0".

In reality, variations arise in the resistance values of the respective resistors 21b and the resistance values of the respective resistors 22b. Respective electric currents output from the voltage-current conversion sections $21(k)$ (k=0 to M−1) and respective electric currents output from the voltage-current conversion sections $22(k)$ (k=0 to M−1) vary with reference to the electric current ΔI or −ΔI.

However, in the course of integration processing of the analogue signal, deviations of the electric currents output from the voltage-current conversion sections $21(k)$ (k=0 to M−1) and deviations of the electric currents output from the voltage-current conversion sections $22(k)$ (k=0 to M−1) from a value of an ideal electric current cancel each other. Hence, the analogue signal substantially input to the error integrator 30 during each of sampling periods accurately corresponds to a sample value indicated by the input digital signal Din acquired during that sampling period.

While receiving from the output buffer 60 the negative feedback conforming to the output voltages VOp and VOn imparted to the load 100, the error integrator 30 integrates an analogue signal conforming to a difference between the sum of the electric currents output from the voltage-current conversion sections $21(k)$ (k=0 to M−1) and the sum of the electric currents output from the voltage-current conversion sections $22(k)$ (k=0 to M−1). The PWM modulation circuit 40 generates the pulses VDp and VDn having a pulse width conforming to the result of integration. Consequently, according to the present embodiment, the load 100 is driven by means of the waveform accurately reflecting the input digital signal Din.

According to the present embodiment, there is provided no particular averaging circuit which averages the sum of the electric currents output from the voltage-current conversion sections $21(k)$ (k=0 to M−1) and the sum of the electric currents output from the voltage-current conversion sections $22(k)$ (k=0 to M−1) along the time axis. The error integrator 30 is caused to perform processing to be performed by the averaging circuit. Hence, the circuit scale is reduced, and a chip area can be reduced when the digital input class-D amplifier is implemented as a semiconductor integrated circuit. Since the averaging circuit is not provided, noise arising in an output of the digital input class-D amplifier is reduced correspondingly, and a reduction in offset voltage and a further reduction in power consumption can be achieved.

The embodiment of the present invention has been described thus far, but other various embodiments of the present invention are also conceivable. Examples of the embodiments are as follows:

(1) In the present embodiment, the present invention is applied to the class-D amplifier which performs pulse width modulation in accordance with the voltages VEp and VEn output from the error integrator. However, the present invention may also be applied to a class-D amplifier which performs pulse density modulation in accordance with the voltages VEp and VEn output from the error integrator.

(2) The present embodiment provides an example where the present invention is applied to a class-D amplifier of a differential configuration. However, as a matter of course, the present invention can be applied to a digital input class-D amplifier not having a differential configuration.

(3) An element to which the digital input class-D amplifier of the present invention is applied is not limited to a power amplifier for audio equipment. For instance, the amplifier may also be used for an amplifier which drives a heat-generating element provided in; for example a thermal printer, an amplifier which generates a drive signal for a display device, and the like.

(4) When the bit length of the digital signal Din input to the DEM decoder 10 is great, the bit length may also be reduced by increasing the sampling frequency by means of a noise shaper. In this case, the sampling frequency of the DEM decoder 10 is increased, but the number of bits to be processed is reduced, and hence the circuit scale can be reduced.

(5) In the embodiment, there are provided the plurality of voltage-current conversion sections 21(k) (k=0 to M−1) and 22(k) (k=0 to M−1) that output to the input terminal of the error integrator 30 electric currents conforming to the plurality of lines of time-series digital signals output from the DEM decoder 10, and current-addition-type D/A converters are provided between the DEM decoder 10 and the error integrator 30. However, voltage-addition-type D/A converters or capacitance-addition-type D/A converters may also be provided between the DEM decoder 10 and the error integrator 30 in place of such a current-addition-type D/A converter. An example of such an D/A converter is provided below.

FIGS. 3 to 6 show examples in which voltage-addition-type D/A converters are provided between the DEM decoder 10 and the error integrator 30.

Figure 3:
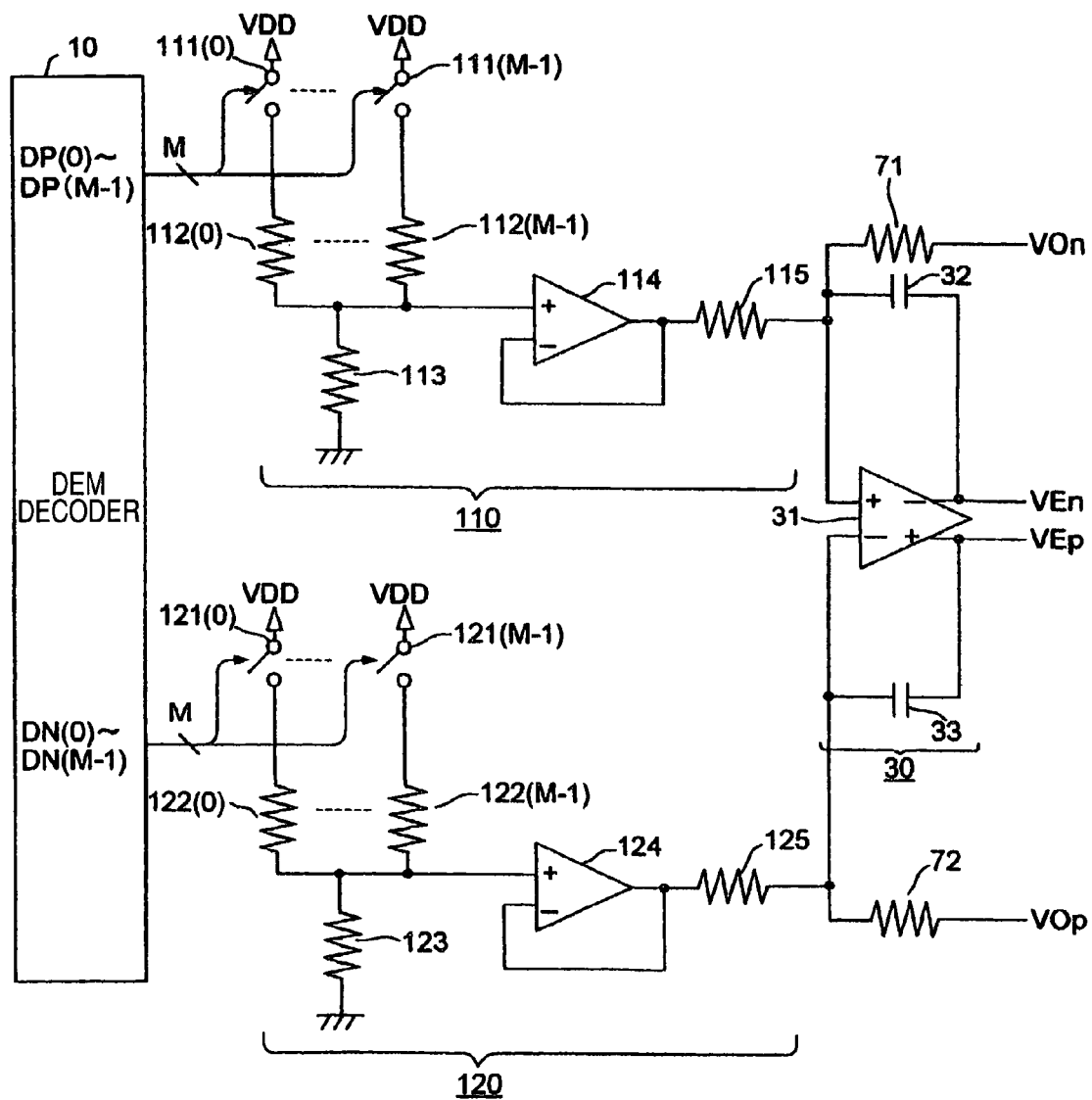
FIG. 3 is a circuit diagram showing a first example in which voltage-addition-type D/A converters are configured between a DEM decoder 10 and an error integrator 30 of the present embodiment.

In the example shown in FIG. 3, a voltage addition circuit 110 and a voltage addition circuit 120 are interposed between the DEM decoder 10 and the error integrator 30. The voltage addition circuit 110 adds voltages conforming to bits of the time-series digital signals DP(k) (k=0 to M−1) output from the DEM decoder 10 and supplies a result of addition to the positive-phase input terminal of the error integrator 30. The voltage addition circuit 120 adds voltages conforming to bits of the time-series digital signals DN(k) (k=0 to M−1) and supplies a result of addition to the negative-phase input terminal of the error integrator 30.

The voltage addition circuit 110 has M switches 111(k) (k=0 to M−1) whose single ends are connected to a power source VDD and which are turned on when the respective time-series digital signals DP(k) assume a value of "1"; M resistors 112(k) (k=0 to M−1) whose single ends are connected to respective other ends of the switches 111(k) (k=0 to M−1) and whose other ends are commonly connected; a resistor 113 interposed between the common node of the M resistors 112(k) (k=0 to M−1) and a ground line; a voltage follower circuit 114 which receives a voltage developing in the common node between the resistors 112(k) (k=0 to M−1) and the resistor 113 and which outputs a voltage having the same value as that of the thus-received voltage; and a resistor 115 interposed between an output terminal of the voltage follower circuit 114 and the positive-phase input terminal of the differential amplifier 31.

The voltage addition circuit 120 is also configured in the same manner as is the voltage addition circuit 110. Namely, the voltage addition circuit has M switches 121(k) (k=0 to M−1) whose single ends are connected to a power source VDD and which are turned on when the respective time-series digital signals DN(k) assume a value of "1"; M resistors 122(k) (k=0 to M−1) whose single ends are connected to respective other ends of the switches 121(k) (k=0 to M−1) and whose other ends are commonly connected; a resistor 123 interposed between the common node of the M resistors 122(k) (k=0 to M−1) and a ground line; a voltage follower circuit 124 which receives a voltage developing in the common node between the resistors 122(k) (k=0 to M−1) and the resistor 123 which outputs a voltage having the same value as that of the thus-received voltage; and a resistor 125 interposed between an output terminal of the voltage follower circuit 124 and the negative-phase input terminal of the differential amplifier 31.

The resistors 112(k) (k=0 to M−1) and the resistors 122(k) (k=0 to M−1) assume the same resistance value, and the resistors 113 and 123 assume the same resistance value. In the present example, the resistors 112(k) (k=0 to M−1) and the resistors 122(k) (k=0 to M−1) are sufficiently greater than the resistors 113 and 123 in terms of a resistance value, and act as a constant-current source. Accordingly, in each of the sub-periods determined by dividing one sampling period by L, an electric current proportional to the number of a value "1" among the bits belonging to the M-bit time-series digital signals DP(k) (k=0 to M−1) flows into the resistor 113, and a voltage proportional to the electric current is output from the voltage follower circuit 114. In each of the sub-periods, an electric current proportional to the number of a value "1" among the bits belonging to the M-bit time-series digital signals DN(k) (k=0 to M−1) flows into the resistor 123, and a voltage proportional to the electric current is output from the voltage follower circuit 124.

When M/2 bits among the time-series digital signals DP(k) assume a value of "1" and when M/2 bits among the time-series digital signals DN(k) assume a value of "0" (i.e., the remaining M/2 bits assume a value of "1"), the voltage follower circuits 114 and 124 output a voltage having the same value (hereinafter taken as, for example, Vref. In the present example, the voltage Vref assumes the same level as the virtual ground level of the positive-phase input terminal and that of the negative-phase input terminal of the differential amplifier 31.

Accordingly, in the present example, when the number of a value "1" among the bits belonging to the time-series digital signals DP(k) is M/2+ΔM bits, a voltage proportional to ΔM develops across the resistor 115, and an electric current proportional to the voltage value flows into the positive-phase input terminal of the differential amplifier 31. In this case, since the number of a value "0" among the bits belonging to the time-series digital signal DN(k) is M/2+ΔM, and the number of a value "1" is M/2−ΔM, a voltage proportional to −ΔM develops across the resistor 125, and an electric current proportional to the value of the voltage flows into the negative-phase input terminal of the differential amplifier 31 (the orientation of the electric current becomes opposite to that of the electric current flowing to the positive-phase input terminal). Accordingly, even in the present example, an advantage similar to that achieved in the embodiment is yielded.

Figure 4:
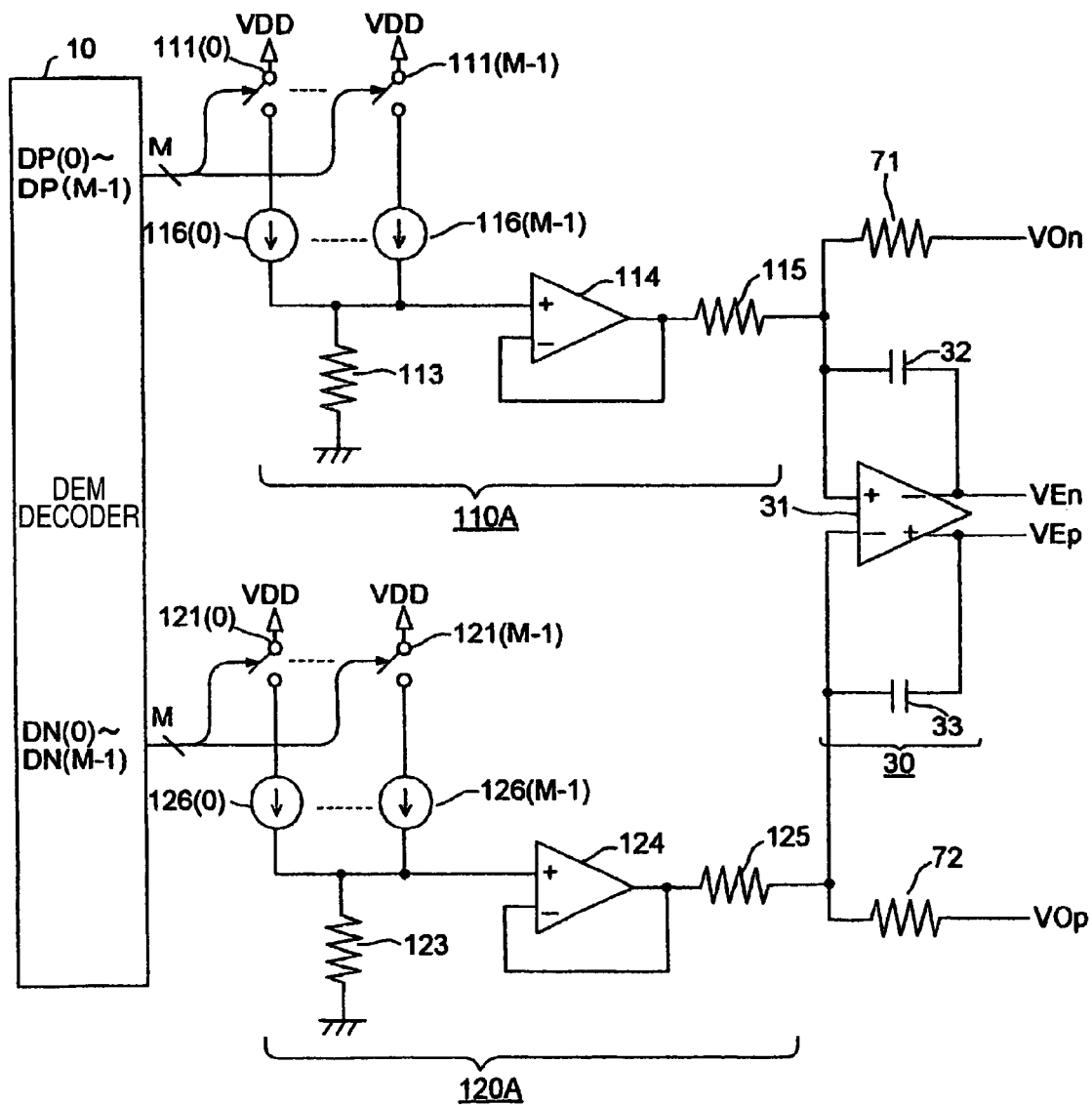
FIG. 4 is a circuit diagram showing a second example in which voltage-addition-type D/A converters are configured between the DEM decoder 10 and the error integrator 30 of the present embodiment.

In the example shown in FIG. 4, the voltage addition circuits 110 and 120 shown in FIG. 3 are replaced with voltage addition circuits 110A and 120A. The voltage addition circuit 110A corresponds to the voltage addition circuit 110 whose resistors 112(k) (k=0 to M−1) are replaced with constant current sources 116(k) (k=0 to M−1). The voltage addition circuit 120A corresponds to the voltage addition circuit 120 whose resistors 122(k) (k=0 to M−1) are replaced with a constant current sources 126(k) (k=0 to M−1). Even in this example, an advantage analogous to that shown in FIG. 3 is yielded.

In an example shown in FIG. 5, the voltage addition D/A converters configured between the DEM decoder 10 and the error integrator 30 are more simplified than those described in connection with the examples. In the present example, the output terminals of the voltage-current conversion sections 21(*k*) (k=0 to M−1) in the embodiment (FIG. 1) are connected commonly to one terminal of a resistor 131, and the other end of the resistor 131 is connected to the positive-phase input terminal of the differential amplifier 31. The output terminals of the voltage-current conversion sections 22(*k*) (k=0 to M−1) in the embodiment (FIG. 1) are connected commonly to one end a resistor 141. The other end of the resistor 141 is connected to the negative-phase input terminal of the differential amplifier 31. In the example, when the source voltage is taken as a VDD, the virtual ground level of the positive-phase input terminal of the differential amplifier 31 and that of the negative-phase input terminal of the same are taken as VDD/2.

Even in the example, when the number of a value "1" among the bits belonging to the time-series digital signals DP(k) (k=0 to M−1) is M/2+ΔM, a voltage proportional to ΔM develops across the resistor 131, and the electric current proportional to the voltage flows to the positive-phase input terminal of the differential amplifier 31. When the number of a value "0" among the bits belonging to the time-series digital signals DN(k) (k=0 to M−1) is M/2+ΔM, a voltage proportional to −ΔM develops across the resistor 141, and the electric current proportional to the voltage flows to the negative-phase input terminal of the differential amplifier 31. Therefore, an advantage analogous to that achieved in the embodiment is yielded.

Figure 5:
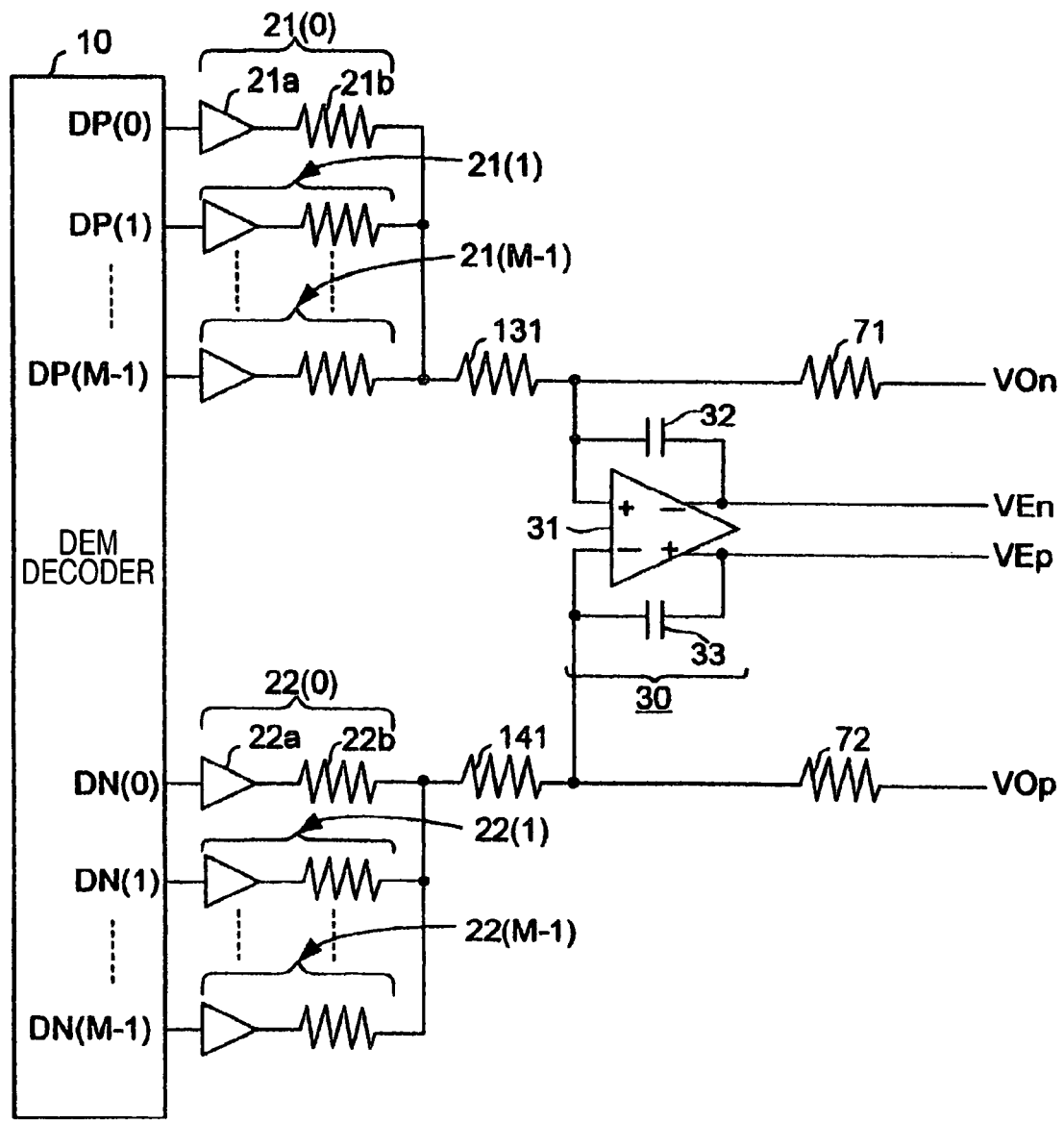
FIG. 5 is a circuit diagram showing a third example in which voltage-addition-type D/A converters are configured between the DEM decoder 10 and the error integrator 30 of the present embodiment.
Figure 6:
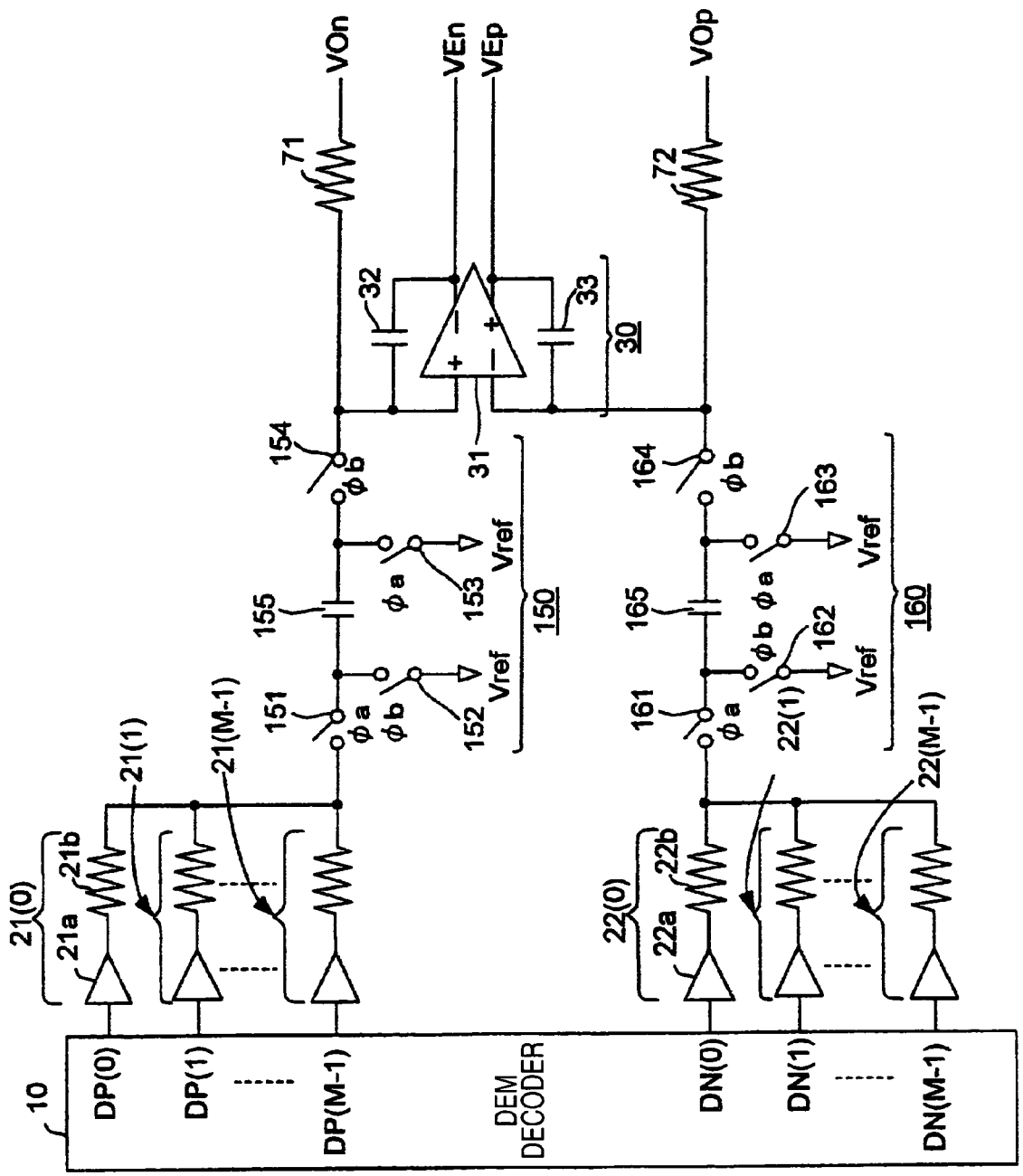
FIG. 6 is a circuit diagram showing a fourth example in which voltage-addition-type D/A converters are configured between the DEM decoder 10 and the error integrator 30 of the present embodiment.

In the example shown in FIG. 6, the resistors 131 and 141 shown in FIG. 5 are replaced with switched capacitor circuits 150 and 160. The switched capacitor circuit 150 has switches 151 to 154 and a capacitor 155. The switch 151, the capacitor 155, and the switch 154 are sequentially interposed between an input terminal [a terminal of the switched capacitor connected to the voltage-current conversions 21(*k*) (k=0 to M−1)] of the switched capacitor circuit 150 and an output terminal (a terminal of the switched capacitor connected to the differential amplifier 31) of the same. A switch 152 is interposed between a power source for generating a reference level Vref and a node located between the switch 151 and one electrode of the capacitor 155. A switch 153 is interposed between the power source for generating the reference level Vref and a node located between the switch 154 and the other electrode of the capacitor 155. A switched capacitor circuit 160 is also configured in the same manner as is the switched capacitor circuit 150, and is built from switches 161 to 164 and a capacitor 165.

As in the case of the example shown in FIG. 5, when the source voltage is taken as VDD, a virtual ground level of the positive-phase input terminal of the differential amplifier 31 and that of the negative-phase input terminal of the same are taken as VDD/2. The reference level Vref is set to the same level as the virtual ground level.

Figure 7:
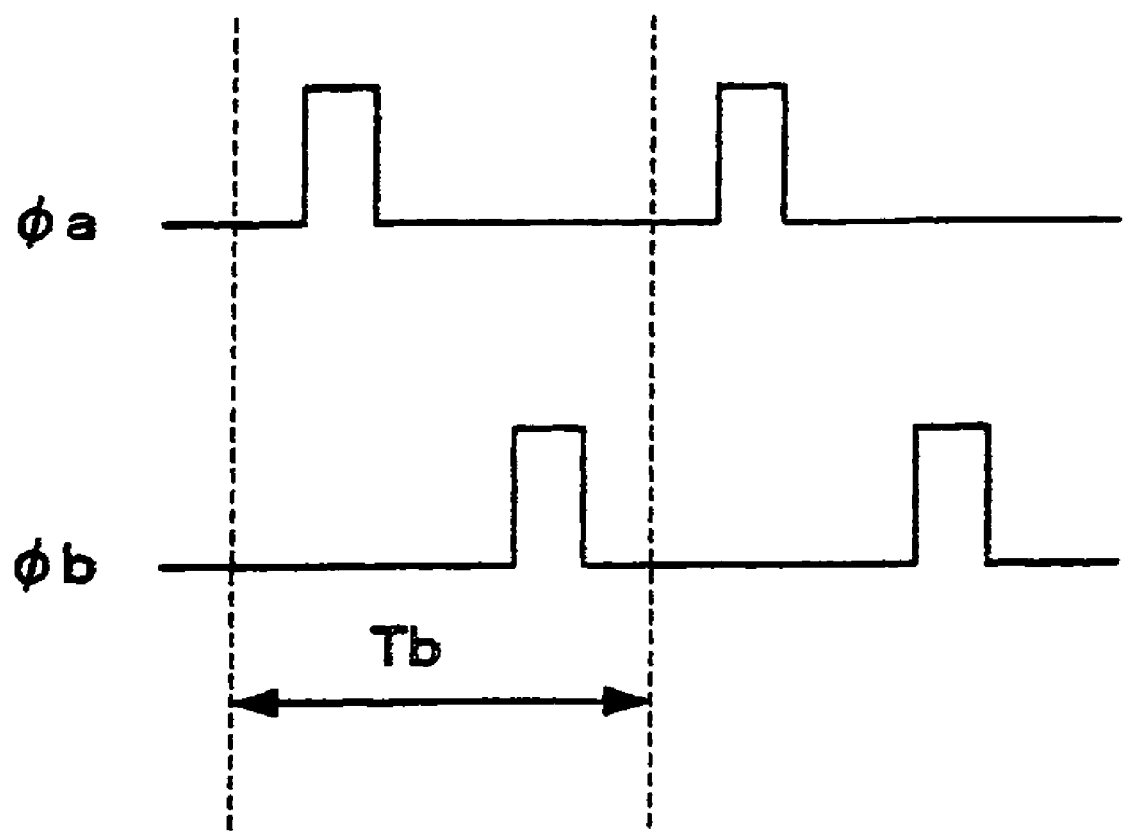
FIG. 7 is a view showing a waveform of a clock signal $\phi a$ and a waveform of a clock signal $\phi b$ used in the fourth embodiment.

Clock signals of two phases φa and φb are given to the switched capacitor circuits 150 and 160. As shown in FIG. 7, the clock signals φa and φb are clock signals which arise one in each of the sub-periods Tb determined by dividing the sampling period by L.

By means of the clock signal φa first arising in each of the sub-periods Tb, the switches 151 and 153 of the switched capacitor circuit 150 and switches 161 and 163 of the switched capacitor circuit 160 are turned on. As a result, electric charges conforming to respective voltages input to the switched capacitor circuits 150 and 160 are stored in capacitors 155 and 165, respectively. By means of the clock signal φb which develops later, the switches 152 and 154 in the switched capacitor circuit 150 and switches 162 and 164 of the switched capacitor circuit 160 are turned on. As a result, the electric charges stored in the capacitor 155 of the switched capacitor circuit 150 flow into the positive-phase input terminal of the differential amplifier 31, and the electric charges stored in the capacitor 165 of the switched capacitor circuit 160 flow into the negative-phase input terminal of the differential amplifier 31.

By means of repetition of these operations, the switched capacitor circuits 150 and 160 function as resistors which supply the positive-phase input terminal and the negative-phase input terminal of the differential amplifier 31 with an electric current proportional to a voltage developing between the input and output terminals of the respective switched capacitor circuits. Therefore, even in the present example, an advantage similar to that achieved in the example shown in FIG. 5 is acquired.

Figure 8:
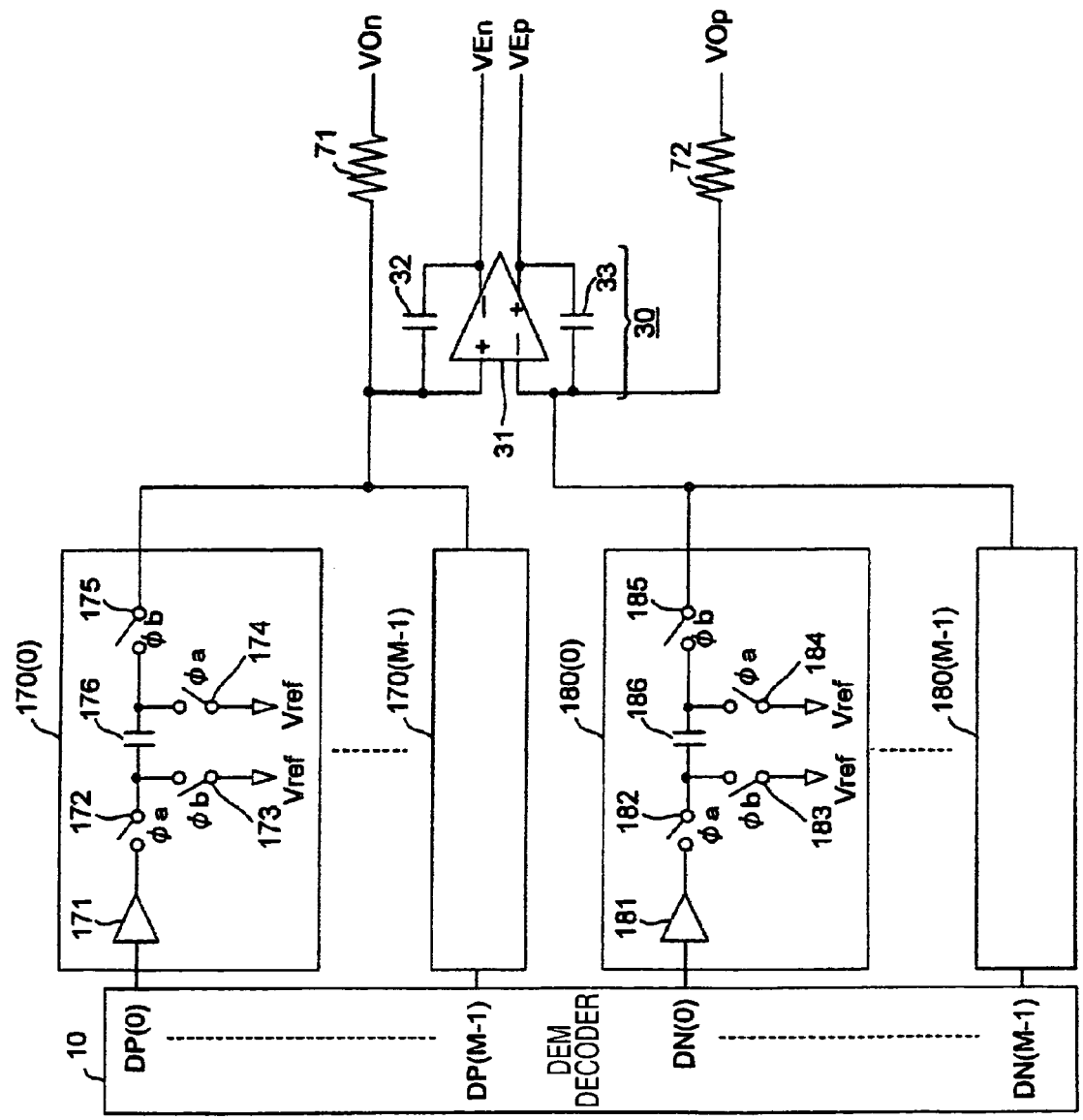
FIG. 8 is a circuit diagram showing an example configuration in which capacitance-addition-type D/A converters are configured between the DEM decoder 10 and the error integrator 30 of the present embodiment.

FIG. 8 shows an example configuration in which a capacitance-addition-type D/A converter is provided between the DEM decoder 10 and the error integrator 30. In the present example, switched capacitor circuits 170(*k*) (k=0 to M−1) and switched capacitor circuits 180(*k*) (k=0 to M−1) are interposed between the DEM decoder 10 and the error integrator 30. The time-series digital signals DP(k) (k=0 to M−1) are imparted from the DEM decoder 10 to the switched capacitor circuits 170(*k*) (k=0 to M−1). The time-series digital signals DN(k) (k=0 to M−1) are imparted from the DEM decoder 10 to the switched capacitor circuits 180(*k*) (k=0 to M−1). Respective output terminals of the switched capacitor circuits 170(*k*) (k=0 to M−1) are connected commonly to the positive-phase input terminal of the differential amplifier 31. Further, respective output terminals of the switched capacitor circuits 180(*k*) (k=0 to M−1) are connected commonly to the negative-phase input terminal of the differential amplifier 31.

Each of the switched capacitor circuits 170(*k*) (k=0 to M−1) has a noninverting buffer 171, switches 172 through 175, and a capacitor 176. Moreover, each of the switched capacitor circuits 180(*k*) (k=0 to M−1) has a noninverting buffer 181, switches 182 through 185, and a capacitor 186. The switched capacitor circuits 170(*k*) (k=0 to M−1) and 180(*k*) (k=0 to M−1) are analogous in configuration to the switched capacitor circuits 150 and 160 shown in FIG. 6 except that the noninverting buffers 171 and 181 are provided at respective input sections.

As in the case with the example shown in FIG. 5, when the source voltage is taken as VDD, the virtual ground level of the positive-phase input terminal of the differential amplifier 31 and that of the negative-phase input terminal of the same are set to VDD/2 in the present example. On the assumption that the number of a value "1" among the bits belonging to the time-series digital signals DP(k) (k=0 to M−1) is M/2+ΔM in each of the sub-periods, the switched capacitor circuits 170(*k*) (k=0 to M−1) supply the positive-phase input terminal of the differential amplifier 31 with an electric charge proportional to ΔM. In the present case, the number of a value "1" among the bits belonging to the time-series digital signals DN(k) (k=0 to M−1) is M/2−ΔM, and the switched capacitor circuits 180(*k*) (k=0 to M−1) supply the negative-phase input terminal of the differential amplifier 31 with electric charges proportional to −ΔM. Accordingly, an advantage analogous to that achieved in the embodiment is yielded even in the present example.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2007-068796 filed on Mar. 16, 2007, the contents of which are incorporated herein for reference.

What is claimed is:

1. A digital input class-D amplifier, comprising:
a decoder which outputs a plurality of lines of time-series digital signals having a density of 1 or 0 conforming to an input digital signal;
an error integrator which integrates a difference between a drive waveform to be applied to a load and a sum of the plurality of lines of time-series digital signals output from the decoder; and
a modulation circuit which generates a pulse modulated with a pulse width or a pulse density based on a result of integration performed by the error integrator,
wherein the load is driven in accordance with the pulse generated by the modulation circuit.

2. The digital input class-D amplifier according to claim 1, wherein the decoder outputs positive and negative sets of the plurality of lines of time-series digital signals and the error integrator has corresponding positive phase and negative phase input terminals, the class-D amplifier further comprising:
a plurality of voltage-current conversion sections which output respective first electric currents and second electric currents corresponding to the positive and negative sets of the plurality of lines of time-series digital signals output from the decoder to the corresponding positive phase and negative phase input terminals of the error integrator; and
a plurality of resistors which respectively negatively feed back third electric current corresponding to the drive waveform to be applied to the load to the positive phase input terminal of the error integrator and a fourth electric current corresponding to the drive waveform to be applied to the load to the negative phase input terminal of the error integrator;
wherein the error integrator integrates a difference between a sum of the first electric currents corresponding to the positive set of the plurality of lines of time-series digital signals and the third electric current negatively fed back to the positive phase input terminal, and integrates a difference between a sum of the second electric currents corresponding to the negative set of the plurality of lines of time-series digital signals and the fourth electric current negatively fed back to the negative phase input terminal.

3. The digital input class-D amplifier according to claim 1, wherein the decoder outputs positive and negative sets of the plurality of lines of time-series digital signals and the error integrator has corresponding positive phase and negative phase input terminals, the class-D amplifier further comprising:
a plurality of voltage addition circuits which respectively sum voltages conforming to the positive and negative sets of the plurality of lines of time-series digital signals output from the decoder and which correspondingly provide a first electric current and a second electric current respectively corresponding to the summed voltages to the corresponding a positive phase and negative phase input terminals; and
a plurality of resistors which respectively negatively feed back a third electric current corresponding to the drive waveform to be applied to the load to the positive phase input terminal of the error integrator and a fourth electric current corresponding to the drive waveform to be applied to the load to the negative phase input terminal of the error integrator,
wherein the error integrator integrates a difference between the first electric current provided from the voltage addition circuits to the positive phase input terminal and the third electric current negatively fed back to the positive phase input terminal, and integrates a difference between the second electric current provided from the voltage addition circuits to the negative phase input terminal and the fourth electric current negatively fed back to the negative phase input terminal.

4. The digital input class-D amplifier according to claim 1, wherein the decoder outputs positive and negative sets of the plurality of lines of time-series digital signals and the error integrator has corresponding positive phase and negative phase input terminals, the class-D amplifier further comprising:
a plurality of switched capacitor circuits which generate respective electric charges conforming to the positive and negative sets of the plurality of lines of time-series digital signals output from the decoder and which respectively supply the electric charges to the corresponding positive phase and negative phase input terminals of the error integrator as first electric currents and second electric currents respectively; and
a plurality of resistors which respectively negatively feed back a third electric current corresponding to the drive waveform to be applied to the load to the positive phase input terminal of the error integrator and a fourth electric current corresponding to the drive waveform to be applied to the load to the negative phase input terminal of the error integrator,
wherein the error integrator integrates a difference between a sum of the first electric currents supplied to the positive phase input terminal and the third electric current negatively fed back to the positive phase input terminal, and integrates a difference between a sum of the second electric currents supplied to the negative phase input terminal and the fourth electric current negatively fed back to the negative phase input terminal.

5. The digital input class-D amplifier according to claim 1, wherein the decoder generates the plurality of lines of time-series digital signals from the input digital signal, by using a dynamic element matching algorithm for distributing variations in circuits which transmit the plurality of lines of time-series digital signals to the error integrator.

* * * * *